US012575440B2

(12) United States Patent
Schmidt et al.

(10) Patent No.: US 12,575,440 B2
(45) Date of Patent: Mar. 10, 2026

(54) ELECTRONICS MODULE AND METHOD FOR PRODUCING IT

(71) Applicant: Rogers Germany GmbH, Eschenbach (DE)

(72) Inventors: Karsten Schmidt, Eschenbach (DE); Andreas Meyer, Wenzenbach (DE); Eckart Hoene, Berlin (DE); Christoph Marczok, Berlin (DE); Tina Thomas, Berlin (DE); Ruben Kahle, Berlin (DE)

(73) Assignee: ROGERS GERMANY GMBH, Eschenbach (DE)

( * ) Notice: Subject to any disclaimer, the term of this patent is extended or adjusted under 35 U.S.C. 154(b) by 916 days.

(21) Appl. No.: 17/056,282

(22) PCT Filed: May 14, 2019

(86) PCT No.: PCT/EP2019/062294
§ 371 (c)(1),
(2) Date: Jun. 1, 2022

(87) PCT Pub. No.: WO2019/219650
PCT Pub. Date: Nov. 21, 2019

(65) Prior Publication Data
US 2022/0285173 A1     Sep. 8, 2022

(30) Foreign Application Priority Data

May 18, 2018     (DE) ..................... 10 2018 111 989.5

(51) Int. Cl.
H01L 21/56          (2006.01)
H01L 23/00          (2006.01)
(Continued)

(52) U.S. Cl.
CPC ........ H01L 21/565 (2013.01); H01L 23/3121 (2013.01); H01L 23/315 (2013.01);
(Continued)

(58) Field of Classification Search
CPC . H01L 21/565; H01L 23/3121; H01L 23/315; H01L 23/481; H01L 24/97;
(Continued)

(56) References Cited

U.S. PATENT DOCUMENTS

2009/0039498 A1     2/2009  Bayerer
2011/0128707 A1     6/2011  Rozman et al.
(Continued)

FOREIGN PATENT DOCUMENTS

DE     102010038154 A1     5/2011
DE     102014109981 A1     1/2015
(Continued)

OTHER PUBLICATIONS

International Preliminary Report On Patentability for International Application No. PCT/EP2019/062294, International Filing Date May 14, 2019, Date of Mailing Nov. 19, 2020, 7 pages.

*Primary Examiner* — Jonathan Han
(74) *Attorney, Agent, or Firm* — CANTOR COLBURN LLP

(57)          ABSTRACT

Electronic module (1) including
    an encapsulation (20),
    a carrier substrate (10) enclosed by the encapsulation (20) and having a component side (25) which has a first metallization layer (15) and on which at least one first electronic component (30) is arranged,
wherein at least one second metallization layer (35) for at least one second electronic component (31), in particular for controlling the first electronic component (30), is provided on an outer side (A) of the encapsulation (2),
wherein the encapsulation (20) has at least one plated-through hole (5) for electrical connection, in particular for direct electrical connection, of the first electronic component (30) and the second electronic component (31).

20 Claims, 4 Drawing Sheets

(51) Int. Cl.
  *H01L 23/31*          (2006.01)
  *H01L 23/48*          (2006.01)

(52) U.S. Cl.
  CPC ............ *H01L 23/481* (2013.01); *H01L 24/97*
      (2013.01); *H01L 2224/48245* (2013.01); *H01L*
          *2224/73265* (2013.01); *H01L 2924/186*
                                    (2013.01)

(58) Field of Classification Search
  CPC . H01L 2224/48245; H01L 2224/73265; H01L
              2924/186; H01L 2224/04105; H01L
              2224/12105; H01L 2224/18; H01L
              2224/32225; H01L 2224/73267; H01L
              2224/92244; H01L 2924/10272; H01L
              2924/1033; H01L 2924/10346; H01L
              2924/351; H01L 25/50; H01L 24/24;
        H01L 23/5389; H01L 24/19; H01L 24/20;
        H01L 25/072; H01L 25/10; H01L 25/16;
        H01L 25/18; H01L 23/34; H01L 23/5384;
              H01L 23/3135; H01L 23/29; H01L
                                    23/295
  See application file for complete search history.

(56)                References Cited

U.S. PATENT DOCUMENTS

2015/0303164 A1*  10/2015  Chen ...................... H01L 24/33
                                                  361/720
2016/0300817 A1*  10/2016  Do .......................... H01L 25/03
2017/0018478 A1    1/2017  Maple et al.
2017/0200666 A1*   7/2017  Hable ................... H01L 21/565
2018/0053745 A1    2/2018  Cheng et al.

FOREIGN PATENT DOCUMENTS

DE      102014218240 A1   9/2015
DE      102016000264 A1   7/2017
JP         2003197849 A   7/2003
JP         2013069807 A   4/2013
JP         2014165240 A   9/2014
JP         2015005681 A   1/2015
JP         2016178272 A  10/2016
KR          920007021 B1  8/1992
WO         2008136251 A1  7/2010
WO         2013136895 A1  9/2013
WO         2014202282 A1 12/2014

* cited by examiner

ELECTRONICS MODULE AND METHOD FOR PRODUCING IT

CROSS-REFERENCE TO RELATED APPLICATIONS

This application is a National Stage filing of PCT/EP2019/062294, filed May 14, 2019, which claims priority to DE 10 2018 111 989.5, filed May 18, 2018, both of which are incorporated by reference in their entirety herein.

BACKGROUND

The present invention concerns an electronic module and a process for its manufacture.

Electronic modules are sufficiently known from the state of the art, for example as power electronic modules. Such electronic modules typically use switchable electronic components that are interconnected on a common carrier substrate via conductor paths. Essential components of the carrier substrate are an insulation layer, which in the case of a metal-ceramic substrate, for example, is made of a material comprising a ceramic, and a metallization layer, which is preferably structured and formed on one side of the carrier substrate to form conductor paths.

Such electronic modules are typically designed for a long service life and high operational reliability in such a way that thermally induced mechanical stresses in the electronic module are avoided as far as possible and heat generated on the component side can be dissipated as optimally as possible, preferably by means of a cooling structure provided for this purpose. The specifications of new electronic components, such as WBG semiconductors (wide bandgap semiconductors), especially semiconductors made of silicon carbide, gallium nitride and/or indium gallium nitride, pose new challenges for the electronic modules as well as new fields of application, e.g. in the field of e-mobility.

From the state of the art are, for example, the publications DE 10 2008 029 829 B4, DE 10 2009 042 399 A1, U.S. Pat. No. 7,589,412 B2 and DE 10 2014 117 086 A1, in which electrical components for forming an electronic module are arranged on a carrier substrate and embedded in an encapsulation. Another example of an electronic module is the component marketed by Anlog Devices called "LTM4636".

SUMMARY

Based on this state of the art, the present invention makes it its task to provide an electronic module which is improved compared to those of the state of the art, in particular with regard to its design, switching behaviour and service life.

According to the invention, the task is solved by an electronic module and a process for manufacturing an electronic module as described herein and in the claims. Preferred embodiments of the invention are indicated in the dependent claims as well as in the following description, especially in connection with the enclosed figures.

In accordance with the invention, an electronic module is provided which comprises an encapsulation and a carrier substrate which is at least partially embedded in the encapsulation and has a component side which has a first metallization layer and on which at least one first electronic component is arranged, wherein at least one second metallization layer for at least one second electronic component, in particular for controlling the first electronic component, is provided on an outer side of the encapsulation, and wherein the encapsulation has at least one through-plating for electrical connection, in particular for direct electrical connection, of the first electronic component and of the second electronic component.

BRIEF DESCRIPTION OF THE FIGURES

Further advantages and features result from the following description of the subject matter of the invention with reference to the attached figures. Individual features of the individual embodiments can be combined within the scope of the invention. In the Figures.

DETAILED DESCRIPTION

Figure 1:
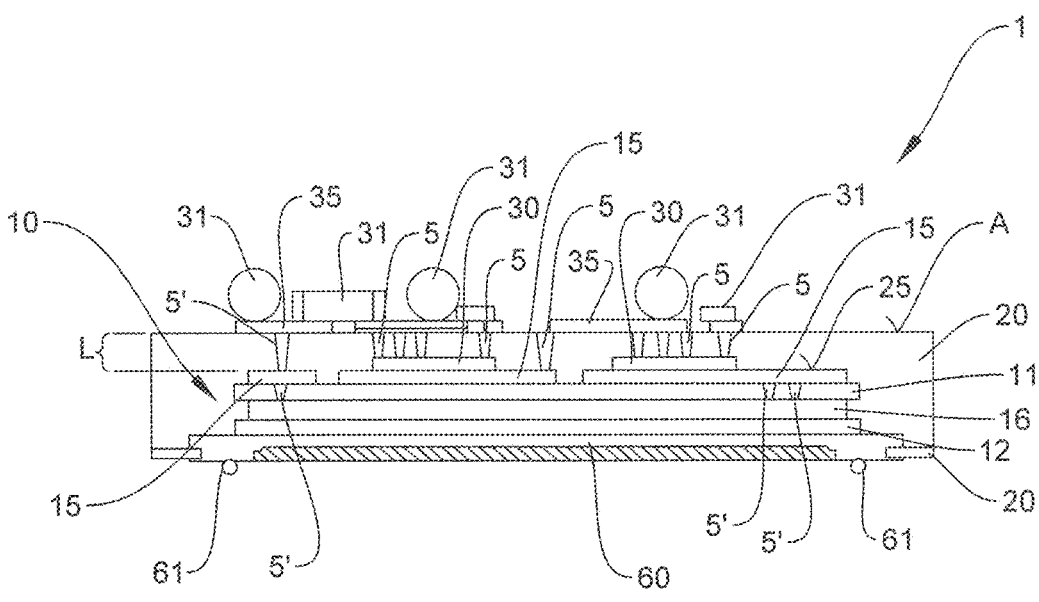
FIG. 1: shows an electronic module according to a first exemplary embodiment of the present invention.

Contrary to the state of the art, the invention provides that the encapsulation at least partially surrounds the carrier substrate, e.g. in the form of a casting material, or that the carrier substrate is embedded in the encapsulation and that the through-hole provides a means for electrical connection between the first electrical component and the second electrical component. The through-plating extends from the outside, in particular from the second metallization layer serving as a connection for the second electronic components, to the first electronic component and/or to the first metallization layer on the component side of the carrier substrate. As a result, not only a compact electronic module is created, but also a comparatively small distance is provided between the first electronic component on the component side on the one hand and the second electronic components on the outside on the other hand. In particular, the invention is characterized by the second metallization layer, which allows a direct connection to the outside of the encapsulation.

It is preferable that a distance between the first metallization layer and the second metallization layer, measured perpendicular to the main plane of extension, is less than 5 mm, preferably less than 2.5 mm and especially preferably less than 1 mm, down to less than 400 μm, for example in about 300 μm, i.e. is as small as possible. Accordingly, in a direction perpendicular to the main plane of extension, there is a very short distance between the first component and the wide component. Furthermore, the vias are embedded in the encapsulation, i.e. the vias are realized after the encapsulation. The vias can be realized mechanically and/or galvanically by wet chemical, paste, vapor phase deposition, screen printing, 3D printing, etc. Furthermore, it is preferably intended that the first metallization layer and the second metallization layer are structured in such a way that the first component and the second component are offset from each other by a lateral distance in a direction parallel to the main plane of extension. This is an advantageous way to avoid that the heat development of the first and the second component influence or impair each other. In order to ensure effective control of the first component by the second component, it is preferable that the lateral distance is less than 35 mm, preferably less than 15 and especially preferably less than 5 mm.

An "embedding" or "being embedded" means, in particular, that the encapsulation is directly adjacent to an outer side of the carrier substrate, i.e. the encapsulation lies directly against the carrier substrate, at least in some areas, and no clear area or cavity is formed between the carrier substrate equipped with the electronic component and the encapsulation. The carrier substrate does not have to be surrounded by the encapsulation on all sides. It is also intended that the encapsulation is solid, i.e. free of cavities.

Furthermore, it is preferably provided that the through-hole plating has a cross-sectional area of less than 5 mm2 in each case, preferably less than 1.5 mm2 and particularly preferably less than 0.5 mm2 in a direction parallel to the main plane of extension, in particular if the through-hole plating is directly connected to the first component, in particular to an upper side of the first component. If the through hole is connected to the first metallization layer, the cross section is preferably smaller than 1.5 mm2, preferably smaller than 2.5 mm2 and especially preferably smaller than 1.5 mm2. Since the cross-section can change, and in particular taper, in the stacking direction for production reasons, the cross-section is preferably understood to be its average along its extension in the stacking direction.

It is also intended that the through hole is flush with the outside of the encapsulation. The part of the second metallization layer that is flush with the through hole also has a contact area that is parallel to the main plane of extension. A ratio between a cross section of the through hole dimensioned parallel to the main plane of extension and the contact area of the part of the second metallization layer adjoining the through hole preferably assumes a value smaller than 0.25, preferably smaller than 0.15 and especially preferably smaller than 0.1. In other words: the through hole is comparatively narrow. Furthermore, it is conceivable that several vias are connected to a common electronic component and the total cross-section of all vias is smaller than the contact area of the second metallization layer.

Furthermore, the vias are preferably characterized by the fact that at least a part of all vias are located above the first electronic components or between the first electronic and the second electronic components, respectively, when viewed in stack direction. It is conceivable that a first part of all vias contacts the first electronic components directly and a second part of all vias contacts the first metallization layer. Preferably the second part is larger than the first part.

The contacting of the first component and the second component via the through-hole can be done directly or indirectly or indirectly. For example, the first component itself can be integrated in a pre-laminate or the through-hole plating contacts the first metallization layer to realize an electrical connection between the first component and the second component.

Preferably, at least one outer side of the carrier substrate remains free from encapsulation. In particular, it is intended that at least the component side of the carrier substrate is completely encapsulated, i.e. covered or enclosed by the encapsulation. Furthermore, it is conceivable that an outer side or outer surface an outer circumference is covered by the encapsulation to more than 40%, preferably more than 50% and especially preferably more than 60%. The direct connection to the carrier substrate or the embedding of the carrier substrate in the encapsulation also improves the stability of the electronic module in an advantageous way and additional measures for stabilization, e.g. between the encapsulation and the carrier substrate, can be dispensed with. It is also conceivable that a protective layer is provided between the first electronic components and the encapsulation, which covers or protects the first electronic components and through which the through-hole plating and/or further through-holes are made.

The first electronic components are preferably switchable components or active components. Preferably, at least one first electrical component is one with a WBG semiconductor (wide bandgap semiconductors), such as a semiconductor made of silicon carbide, gallium nitride and/or indium gallium nitride. Examples for an electronic component are MOSFETs ("metal-oxide-semiconductor field-effect transistor") or IGBTs ("insulated-gate bipolar transistor"). The first components can also be combined as pre-composites or "prepackaging". In such a pre-composite, one or more first electronic components are arranged, for example, on a printed circuit board and embedded in a matrix. An example of a pre-composite can be found in DE 10 2014 117 086 A1 as a redistribution structure in which an electrical component is integrated into a dielectric matrix. The disclosure content of DE 10 2014 117 086 A1 regarding the pre-composite or the redistribution structure is explicitly referred to. Further examples of a pre-composite that are explicitly referred to can be found in the articles "Development of Embedded Power Electronics Modules for Automotive Applications" by L. Boettcher et al. and "Embedding of Power Semiconductors for Innovative Packages and Modules" by L. Boettcher et al.

As second electronic components and/or contact elements are preferably driver—or control elements, especially "gate drivers", and/or connecting devices that serve e.g. as load connection for an input signal or for power supply, and/or capacitors, for example intermediate capacitors and are especially contacted directly to the second metallization layer serving as connection, e.g. soldered or sintered on. A "gate driver", e.g. a MOSFET driver, IGBT driver or half-bridge driver, means in particular a discrete or integrated electronic circuit which drives power switches, such as MOSFETs or IGBTs. In the case of control elements as second electronic components, the first electronic components on the component side can be better controlled, since long transmission paths for the control signal from the control element on the outside to the first electronic component to be controlled can be avoided in an advantageous way. A further advantage resulting from the comparatively short conductor paths is a reduction of parasitic inductances that would otherwise have to be expected if no encapsulation and no through-hole for the electrical connection between the outside of the encapsulation and the component side of the carrier substrate were provided.

A via is an electrically conductive path that passes through the encapsulation or connects two opposite sides of the encapsulation with each other. The via can be made of the same metal or material as the first metallization layer and/or the second metallization layer or can be different. It is also conceivable that the through hole is completely or only partially filled with a conductive material. Furthermore, the through-hole plating preferably runs in a straight line. In this case, the through-hole can run parallel or at an angle to a direction perpendicular to the main plane of the carrier substrate. Furthermore, the first electronic component can be contacted via a side facing away from the carrier substrate or via a side facing the outside of the encapsulation, i.e. electrical connections can also be led "upwards" out of the encapsulation. In the case of pre-lamination or prepackaging, it is advantageous to create a pre-laminated contact surface on a side of the pre-laminate that faces the outside of the encapsulation when the component is installed. In this case, it is advantageous to increase the preconnection-side contacting area in order to facilitate the connection to the through-hole contacting in the encapsulation. For example, a ratio between a diameter of the through-hole plating measured parallel to the main plane of extension and the pre-laminate side contacting area measured parallel to the main plane of extension assumes a value between 0.1 and 1, preferably between 0.15 and 0.8 and preferably between 0.3 and 0.6.

It is preferable that the first electronic components in the electronic module have a contact on a side facing the outside of the encapsulation, especially the second metallization layer, and are connected to the through-hole via this contact.

In particular, it is intended that the encapsulation is a cast part and preferably made of a plastic by means of casting, e.g. injection moulding. In this case, the encapsulation in the assembled electronic module interacts with the carrier substrate in a form, force and/or material-locking manner. For example, the encapsulation comprises an undercut or a nose-like projection, via which the encapsulation can interact with the assembled carrier substrate in a form-fit manner. In particular, the encapsulation can be clipped to the carrier substrate or is clipped to the carrier substrate, preferably on its side opposite the component side, which is often used for cooling purposes. Suitable casting materials, also known as moulding compounds, are casting resins such as synthetic duroplastics. Preferably, the encapsulation is made of an epoxy casting component as encapsulation material. The encapsulation component has a comparatively high glass transition temperature, e.g. above 200° C., a bending strength between 10 and 15 kg/mm2 and is particularly hardenable. For example, the material is Hysol® MG 15F-MOD2. Furthermore, it is preferably intended that a filling material, for example comprising SiO2 and/or an aluminum oxide, is added to the encapsulation material.

Materials conceivable as materials for the first metallization layer or the second metallization layer are copper, aluminum, molybdenum and/or their alloys, as well as laminates such as CuW, Cu Mo, CuAl, AlCu and/or CuCu, in particular a copper sandwich structure with a first copper layer and a second copper layer, wherein a grain size in the first copper layer differs from a second copper layer. Furthermore, it is preferably intended that the first metallization layer and/or the second metallization layer are surface modified. As a surface modification, for example, a sealing with a precious metal, in particular silver and/or gold, or ENIG ("Electroless nickel immersion gold") or an edge sealing at the first or second metallization layer to suppress crack formation or expansion is conceivable.

Preferably, the second metallization layer is structured and/or the first electronic components can be controlled by several second electronic components via through-hole plating.

According to a preferred embodiment of the present invention, the carrier substrate is a metal-ceramic substrate, the metal-ceramic substrate having a structured first metallization layer on its component side, the metal-ceramic substrate preferably being of multilayer design. Essential components of the metal-ceramic substrates are an insulation layer made of a ceramic and the metallization layer bonded to the insulation layer. Because of their comparatively high insulation strength, insulation layers made of ceramic have proven to be particularly advantageous. By structuring the first metallization layer, conductor paths and/or connection areas for the first electrical components can be realized. In particular, the metal-ceramic substrate has three or five layers. Due to the multi-layer design, it is advantageously possible to use comparatively thick metallic intermediate layers, while several ceramic layers are used for stabilization. As a result, the thermal resistance can be reduced and a heat spread can be specifically adjusted. In particular, it is intended that the thickness of the insulation layer made of ceramic is adapted to the required insulation strength.

Preferably, the Al2O3, Si3N4, AlN, HPSX ceramic (i.e. a ceramic with an Al2O3 matrix comprising an x percent share of ZrO2, e.g. Al2O3 with 9% ZrO2=HPS9 or Al2O3 with 25% ZrO2=HPS25), SiC, BeO, MgO, high-density MgO (>90% of the theoretical density), TSZ (tetragonally stabilized zirconium oxide) or ZTA as material for the ceramic. It is also conceivable that the insulating layer is designed as a composite or hybrid ceramic, in which several ceramic layers, each differing in terms of its material composition, are arranged on top of each other and joined together to form an insulating layer in order to combine various desired properties. Preferably, a highly thermally conductive ceramic is used for the lowest possible thermal resistance.

Preferably, the encapsulation should be one-piece or integral or monolithic. One-piece" means in particular that the encapsulation cannot be broken down into further individual parts without destruction. This results in a particularly stable encapsulation that provides optimum protection for the encapsulated components. Furthermore, it is preferably intended that the second metallization is formed on the outside of the electrical module in its manufactured state. In the manufactured state, the electronic module is not embedded in a further encapsulation which, for example, encapsulates the external second electronic components. This allows easy access to the second electronic components on the outside of the manufactured electronic module. In a further embodiment of the present invention, the manufactured electronic module is surrounded by a removable casing so that the second electronic components can be easily accessed by removing the casing.

It is preferably provided that the carrier substrate has a primary layer, a secondary layer and a metallic intermediate layer arranged between the primary layer and the secondary layer, in particular as an electronic return conductor, the intermediate layer preferably
- is thicker than the primary layer and/or the secondary layer and/or
- is thicker than 1 mm, preferably thicker than 1.5 and especially preferred thicker than 2.5 mm.

Such thick metallic interlayers act in a beneficial way as temporary storage and thus improve the thermal impedance Zth. In particular, the thickness supports the heat spread during heat dissipation, in which the heat is conducted from the component side via the carrier substrate to a side of the carrier substrate opposite the component side. In particular, it is intended that the intermediate layer is designed as a single layer or as a single piece. The intermediate layer can preferably serve as an electrical return conductor by having an additional through-hole plated in the primary layer, so that not only the first metallization layer can be used to conduct current, but also the metallic intermediate layer.

Furthermore, it is preferably intended that the carrier substrate with the primary layer, the secondary layer and the metallic intermediate layer is composed as a structure of five or more layers. In particular, for the five-layer structure, two metallic intermediate layers are provided between the primary layer and the secondary layer, whereby a tertiary layer is arranged between the two metallic intermediate layers. Preferably at least two layers have a comparatively high modulus of elasticity. This further reduces the tendency to twist during operational and environmental temperature changes. Preferably, the primary layer, the secondary layer and/or the tertiary layer are made of a material comprising ceramics, for example one of the ceramics mentioned above. This is an advantageous way of meeting the desired requirements for insulation strength. It is also conceivable, however, that the secondary and/or tertiary layer are not made of a material comprising a ceramic, since these essentially serve to stiffen the carrier substrate and do not contribute to insulation. It would be conceivable here, for example, to use molybdenum and/or tungsten instead of a ceramic.

In a preferred embodiment of the present invention, it is provided that the electronic module and/or the carrier substrate is thermomechanically symmetrical, in particular along a stacking direction perpendicular to a main plane of extension of the carrier substrate. By a thermomechanically symmetrical configuration is meant in particular that thermomechanical coefficients of expansion are symmetrical when viewed in the stacking direction. The thermomechanical coefficient of expansion is a measure for the expansion of the respective layer during a temperature change or a temperature change. Preferably, the electronic module can be divided into virtual sub-substrates, in particular with a virtual primary substrate, a virtual secondary substrate and a virtual intermediate layer, and the thermal expansion coefficients of the virtual sub-substrates are distributed symmetrically in the stacking direction. The symmetrical design of the coefficients of expansion provides an electronic module that is comparatively low in distortion compared to operational or environmental temperature changes. As a result, defects or cracks can be avoided, which would otherwise be caused by thermally induced mechanical stress. Especially in combination with a carrier substrate with a comparatively thick metallic intermediate layer, especially above 1 mm, it is possible to provide a comparatively high coefficient of thermal expansion for the entire carrier substrate. Consequently, the adaptation of the thermal expansion coefficient for the encapsulation of the electronic module is simplified, since the effort to reduce the typically high thermal expansion coefficient of the encapsulation can be reduced. Finally, to reduce the thermal expansion coefficient, a filling material is inserted into the encapsulation material. The increased coefficient of expansion for the carrier substrate allows the amount of filler material to be reduced, which in turn reduces the cost of manufacturing the electronic module.

Preferably, a further via is provided for the electronic connection of the interlayer to the second electronic component, with the further via passing through the encapsulation and the primary layer. The further via can run through the first metallization layer of the carrier substrate or comprise several partial sections. For example, the further via comprises a section in the encapsulation and a section that runs through the primary layer. By means of the further through-hole plating it is advantageously possible to realize a direct electrical connection from the outside of the encapsulation to the intermediate metallic layer between the primary layer and the secondary layer.

In a further embodiment of the present invention, it is provided that a contacting plane is provided in the encapsulation, which is arranged between the outside of the encapsulation and the component side of the carrier substrate and which, for connecting at least two through-holes, extends obliquely and/or transversely to the direction of extension/running direction of the through-holes. In this way, several vias can be electrically connected to each other so that the area within the encapsulation can already be used as a distribution system, i.e. as a three-dimensional conductor system. Furthermore, it is conceivable to connect further vias with one or more vias by means of the contact level. Preferably, the contacting planes extend parallel to the main extension plane of the carrier substrate and are designed as an additional structured metallization layer. For the production of such contacting planes it is conceivable, for example, that the encapsulation can be assembled in several parts or realized in several successive injection molding and/or injection press processes. Furthermore, the contacting levels allow a simple way to realize a lateral offset between the first component and the second component, especially without plated-through holes running diagonally to the stacking direction.

Preferably, the carrier substrate has a cooling structure on its side opposite the component side, whereby the electronic module preferably has a sealing element and/or sealing material, e.g. a silicone, for fluid-tight connection to a fluid cooling device. In particular, the cooling structure is advantageously integrated into the carrier substrate and is not enclosed by the encapsulation, i.e. it is exposed. The integration allows a low effort in the installation of the electronic module, since an additional working layer, in which a base plate and/or a cooler is connected to the carrier substrate, e.g. soldered, sintered and/or clamped, can be dispensed with in an advantageous way. The fluid cooling device serves in particular for the approach and removal of a cooling fluid, especially a cooling liquid. Preferably, the cooling structure comprises fins that protrude into a channel formed by the cooling structure and the fluid cooling device. For sealing the channel formed between the carrier-substrate side cooling structure and the fluid cooling device, a sealing element is preferably provided, which is integrated into the electronic module, preferably arranged at the height of the cooling structure essentially in the stacking direction. Preferably, the sealing element is ring-shaped or bead-shaped and preferably encircles the cooling structure, in particular the fins of the cooling structure. Preferably, the sealing element is arranged on the encapsulation, for example in a groove provided for this purpose.

Another advantage of integrating the cooling structure directly to the carrier substrate is that material between the cooling structure and the carrier substrate or secondary layer can be dispensed with. Such a TIM (thermal interface material) usually has a reduced thermal conductivity compared to the other materials used in the carrier substrate. Dispensing with the TIM material and avoiding interfaces significantly improves the thermal resistance of the carrier substrate or the electronic module.

In a further embodiment of the present invention, it is intended that the through-hole has a length of between 0.1 and 15 mm, preferably between 0.15 and 8 mm and particularly preferably between 0.2 and 5 mm. It has turned out to be advantageous that with such short conductor paths or vias, the influence of parasitic inductances can be significantly reduced and the control of the first electronic component by the second electronic component is thus improved.

A further subject-matter of the present invention is a process for producing an electronic module, in particular an electronic module according to the invention:

Providing a carrier substrate equipped with a first electronic component, wherein the first electronic component is bonded to a first metallization layer of the carrier substrate at least partial encapsulation of the loaded carrier substrate with an encapsulation forming a through hole in the encapsulation to provide an electrical connection between the first electronic component and a second electronic component on an outside of the encapsulation; and Formation of a second metallization layer, especially a structured second metallization layer, for the second electronic component on the outside of the encapsulation.

All features and advantages described for the metal-ceramic substrate in accordance with the invention can also be transferred to the process in accordance with the invention and vice versa. In particular, it is intended that the second metallization layer is connected to the first component and/or the first metallization layer via the through-hole plating.

To provide the carrier substrate, for example, a primary layer, a secondary layer, an intermediate layer, a first metallization layer and/or a cooling structure are joined together in a common bonding process. Different bonding methods can also be used. As bonding methods, e.g. DCB (direct copper bonding) or DAB (direct aluminium bonding) methods, or the bonding by means of an active solder, i.e. an AMB (active metal brazing) method, come into question.

To form the through-hole plating, it is preferably intended that a recess, in particular a drill hole, is made in the finished encapsulation. This is preferably realized with laser light. However, it is also conceivable that the hole or a through-hole is milled into the encapsulation for the through-hole plating. If laser light is used, a recess is preferably formed that tapers in the direction of the carrier substrate, for example a conical taper. To place the through-hole correctly, an edge of the encapsulation or a marking can be used as a reference. Following the produced recess, the recess is filled completely or partially with a conductive material. For example, a paste of a conductive material can be introduced into the through-hole and then the paste is cured.

Preferably, the first electronic components are prepared or provided in such a way that they have a contact surface which, when mounted on the carrier substrate, faces the outside or the through hole. It is conceivable that contact holes are made in the first electronic component and that the connection is made by physical gas phase deposition. Subsequently, the terminal contact is strengthened by chemical deposition, for example by means of electroplating. Preferably, the first electronic components or groupings of first electronic components with the desired contact areas are provided.

Preferably, it is intended that the encapsulation is formed by injection molding and/or transfer molding, especially around the loaded carrier substrate. In particular, the encapsulation is formed in an injection molding and/or injection compression molding process. In this case, preferably the loaded carrier substrate, in particular on the component side, is covered with the injection moulding and/or injection press material after it has been inserted into the injection moulding and/or injection press moulded part. The injection moulding and/or injection press moulding process can be, for example, a transfer moulding, a compression moulding and/or a liquid encapsulation process. If one or more contacting levels are provided, it is conceivable that the encapsulation is realized in several successive injection molding and/or injection press processes, whereby between each of these injection molding and/or injection press processes a contacting level with or without further components is realized by applying a structured metallization layer to the last molded section of the encapsulation.

In a further embodiment of the present invention, it is intended that the second metallization layer on the outside of the encapsulation by a metal foil inserted into an injection and/or injection press mould during the injection moulding and/or injection press process, by physical vapour deposition and/or electrochemical deposition is realized. In particular, electrochemical deposition, for example by means of electroplating, serves to reinforce the structure that has already been started or initiated by the metal foil or physical vapor deposition. For example, the structure provided by the vapour deposition or the metal foil is reinforced by galvanic copper, especially after or before a structuring. For example, a stencil is used in the vapor phase deposition process. If a metal foil is intended to realize the second metallization layer, it is conceivable that this metal foil is already structured. Alternatively or in addition, it is conceivable that the second metallization layer is structured after its production. It is also conceivable that the second metallization layer is glued onto the encapsulation. It is also conceivable that the second metallization layer is applied by means of a printing process, in particular a 3D printing process. It is also conceivable that after the second metallization layer is provided, it may be post-processed. For example, the second metallization layer is sealed (with gold; silver, ENIG) and/or made solderable.

Further advantages and features result from the following description of preferred embodiments of the subject matter of the invention with reference to the attached figures. Individual features of the individual embodiments can be combined within the scope of the invention.

FIG. 1 shows an electronic module 1 according to a first exemplary embodiment of the present invention. Essential components of such an electronic module 1 are a carrier substrate 10 and an encapsulation 20, whereby the carrier substrate 10 is at least partially embedded in the encapsulation 20, i.e. the carrier substrate 10 is at least partially encapsulated in the encapsulation 20. The carrier substrate 10 has a component side 25 with a first metallization layer 15, the first metallization layer 15 being structured to form conductor tracks or connection pads. First electronic components 30 are connected to the component side 25, which are preferably interconnected to form at least part of an electronic circuit. For example, the first electronic components comprise semiconductors, especially WBG semiconductors (wide bandgap semiconductors), such as a semiconductor made of silicon carbide, gallium nitride and/or indium gallium nitride, whose band gap between a valence band and the conduction band lies between 2 eV and 4 eV or above. In particular, electronic module 1 is a power electronics module and is used, for example, to convert electrical energy with switching electronic components. It is conceivable, for example, that the electronic module could be used as a DC voltage converter, inverter and/or frequency converter in the field of electronic drive technology, especially in the area of e-mobility, as a solar inverter and/or converter for wind power plants for feeding regeneratively generated energy into the grid or as a switched-mode power supply or DC-DC converter.

To control the first electronic components 30 on the component side 25, a second metallization layer 35, which serves in particular as a connection, is provided on the outside A of the encapsulation 20 for at least one second electronic component or contact element 31. The second metallization layer 35 is preferably also structured. For example, the second electronic component 31 is a control element, such as a gate driver, an intermediate capacitor, a load connection, a connection for power supply or similar. To provide a direct electrical connection between the first electronic component 30 and the second electronic component 31, at least one via 5 is provided in the encapsulation 20. The via 5 extends from the outside A of the encapsulation 20 to the component side 25 of the carrier substrate 10.

Preferably, it is intended that a distance between the first electrical component 30 on the component side 25 and the second electrical component 31 on the outer side A is dimensioned less than 10 mm, preferably 5 mm, particularly preferably 2.5 mm, in particular 1 mm, down to less than 300 µm, i.e. as small as possible, by means of through-hole plating 5. A length L of the through hole 5 preferably corresponds to the distance between the first component 30 and the second component 31.

Preferably, the carrier substrate 10 comprises a primary layer 11, a secondary layer 12 and a metallic intermediate layer 16 arranged between the primary layer 11 and the secondary layer 12, whereby the primary layer 11, the secondary layer 12 and the intermediate layer 16 extend along a main plane HSE and are arranged one above the other along a stacking direction S perpendicular to the main plane HSE. The metallic intermediate layer 16 preferably serves as an electrical return conductor, which is advantageous for reducing parasitic inductances. While the primary layer 11 and/or the secondary layer 12 are primarily intended for stiffening the carrier substrate 10, the intermediate layer 16, in addition to its optional function as an electrical return conductor (if there is a through-connection through the primary layer), serves in particular as a heat sink or temporary heat accumulator, in which an (additional) heat spreading takes place. As a temporary heat accumulator, the intermediate layer improves a thermal impedance Zth of the carrier substrate. The heat spread leads in an advantageous way to a homogeneous temperature distribution on a side of the carrier substrate 10 opposite to the component side 25 of the carrier substrate 10, through which the heat developed by the first components shall be dissipated via a cooling structure 60 or another cooling device. For this purpose, the intermediate layer 16 is preferably thicker than the primary layer 11 and/or the secondary layer 12 is and/or is thicker than 1 mm, preferably thicker than 1.5 and especially preferably thicker than 2.5 mm.

Preferably, the coefficients of thermal expansion or the expansion of the individual components of the electronic module 10 are selected in such a way that the coefficient of thermal expansion is essentially symmetrical or as symmetrical as possible when viewed in stacking direction S. If the metallic intermediate layer 16 with a thickness greater than 1 mm is used and thinner primary layers 11 or secondary layers 12 are used, especially ceramic layers, it is then possible to realize a comparatively high coefficient of thermal expansion CTE for the carrier substrate 10 in an advantageous way. This comparatively high coefficient of thermal expansion simplifies the adjustment of the thermal expansion coefficient of the encapsulation 20, which would otherwise have to be reduced by means of an appropriate filler material. As a result, the material costs for the filling material can be reduced in a beneficial way.

The encapsulation 20 in particular ensures that the design is as compact as possible. In particular, the encapsulation is designed in such a way that the encapsulation interacts with the carrier substrate 10 in a positive, non-positive and/or form-fit manner in the assembled state. The carrier substrate 10 is preferably embedded in the encapsulation 20 at least on its component side 25, i.e. the encapsulation completely encloses the component side 25. In the design shown in FIG. 1, a cooling structure 60 is provided on a side opposite the component side 25. In particular, the cooling structure 60 comprises fins. Furthermore, it is intended that cooling structure 60 is not enclosed by encapsulation 20, i.e. the cooling structure and/or its fins are exposed. Instead, Cooling Structure 60 is intended for direct connection to a fluid cooling device, e.g. a corresponding channel that carries a cooling fluid to and from the cooling structure. A sealing element 61 is provided for sealing a fluid channel formed between the fluid cooling structure and the carrier-substrate side cooling structure 60. Preferably, the sealing element 61 is designed circumferentially in a plane parallel to the main plane of extension HSE.

Figure 2:
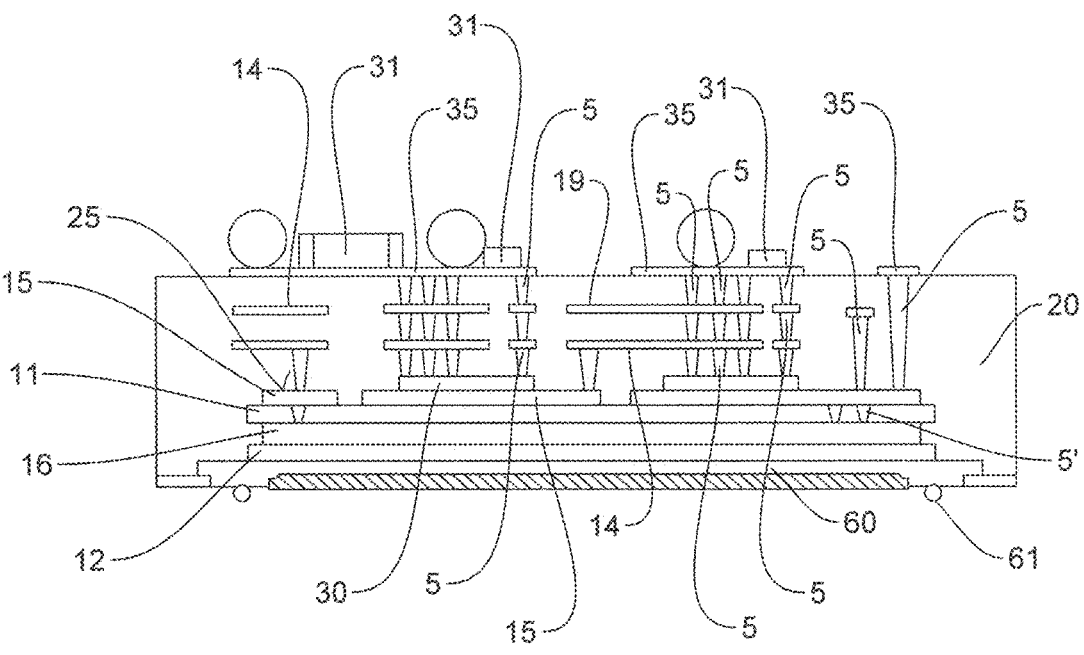
FIG. 2: shows an electronic module according to a second exemplary embodiment of the present invention.

FIG. 2 schematically shows an electronic module 10 according to a second version of the present invention. The design in FIG. 2 differs from that in FIG. 1 only in that several contact levels 14 are provided in the encapsulation 20. These contacting levels 14 extend essentially obliquely or transversely to the direction of the vias 5, whereby the direction of the vias in the design shown is parallel to the stacking direction. However, it is also conceivable that the plated through hole direction is oblique to the stacking direction S. Several vias 5 can be connected to each other in an advantageous way using the vias 14. Preferably, several of the other contacting levels 14 run parallel to each other, especially parallel to the main extension level.

Figure 3:
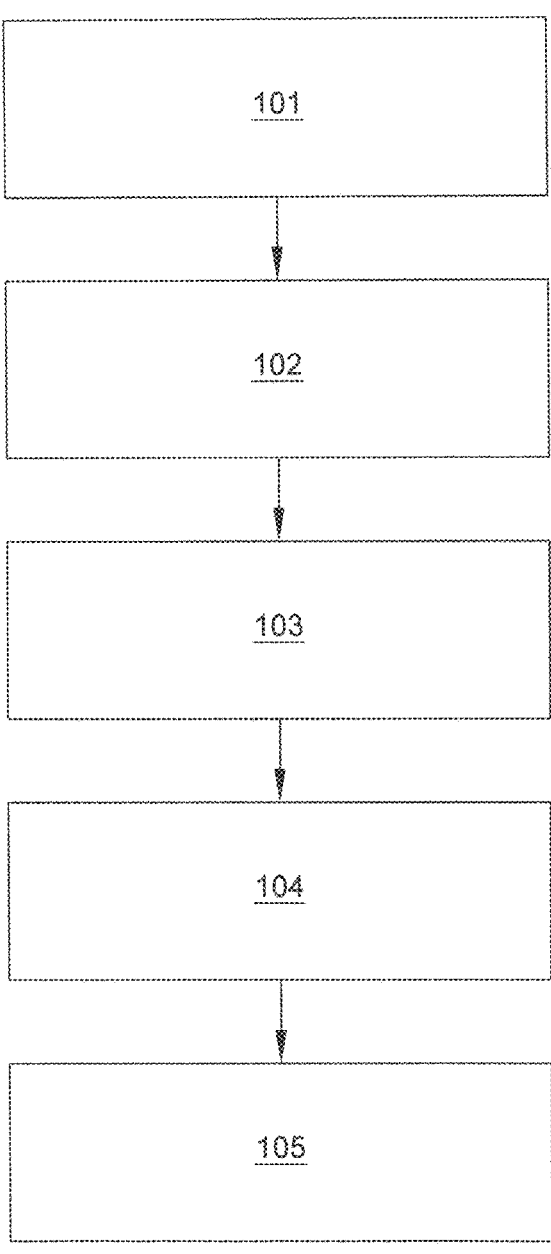
FIG. 3: schematically shows a process for manufacturing an electronic module according to an exemplary embodiment of the present invention, and FIG. 4. Is an example of a production of a pre-laminate.

FIG. 3 schematically shows a process for the production of an electronic module 10. It is intended that a carrier substrate 10 is provided first. In particular, the metallic intermediate layer 16 and/or a cooling structure 60 are prepared for the carrier substrate 10. Subsequently, the primary layer 11, the secondary layer 12, the metallic intermediate layer 16 and/or the cooling structure 60 are joined together in a common or several individual bonding processes. The bonding process is preferably a DCB or DAB process or a bonding by means of an active solder. To provide conductor paths and connection areas, the first metallization layer 15 is structured on the component side 25, for example by an etching process. Preferably, the component side 25 is then surface modified by nickel plating, silver plating, edge sealing or something similar.

It is also planned that the first electronic components 20 for connection to the component side 25 will be prepared for the electrical module 10 and provided, for example, as a pre-laminate. In particular, 30 contacts will be implemented on the electronic components in such a way that the contacts in a state installed in electronic module 1 face the outside A of the encapsulation 20. For this purpose, contact holes are made in the pre-composite. The inserted contacts can be copper-plated by means of physical vapour deposition and then galvanized to reinforce them.

After completion of the carrier substrate 10, the pre-composite is attached to the structured metallization layer 15 on the component side 25 of the carrier substrate 10, e.g. soldered or sintered on. The carrier substrate 10 equipped with the pre-composite is then encapsulated. Preferably, an injection molding and/or injection press process is used for encapsulation 102. For this purpose, the assembled carrier substrate is placed in an injection mold. Preferably, the injection mold is designed in such a way that the cooling structure 60 faces away from a cavity to be filled during injection molding. Thus, cooling structure 60 is not covered by the plastic material used in injection molding and/or injection-pressing.

Furthermore, it is planned that a formation 103 of a through-plating of the encapsulation 20 is carried out by, for example, using laser light to create a recess, in particular a hole or drill hole, in the encapsulation 5. The holes and bores are essentially conical in shape. This conical shape typically results from a focusing of a laser beam with which the recess is realized. It is also intended that the hole or bore hole is filled with a metal to form the through-hole 5, for example by using a paste. For orientation on the outside A when realizing the holes, preferably markings are provided. Preferably, the markings are holes milled into the encapsulation 20, which can also be used, for example, to align the encapsulation 20 before the holes are made.

Furthermore, it is conceivable that a metal foil is inserted into a used injection mold with which the encapsulation is formed. After injection molding and/or injection compression molding, this foil provides the second metallization layer 35 for the second electronic components 31. In addition or alternatively, it is conceivable that the second metallization layer 35 is produced on the injection-molded encapsulation 20 by means of a physical vapor deposition process or a 3D printing process after injection molding and/or injection-pressing. Preferably, the second metallization layer is reinforced by a metal applied by means of electroplating, e.g. electroplated copper.

The formation of the metallization layer 104 preferably involves structuring the second metallization layer 35 on the outer side A. It is also conceivable that a solder resist is used and/or the second metallization layer 35 on the outer side A is post-treated. As an after-treatment, a surface modification 105 in the form of sealing with ENIG (electroless nickel immersion gold), silver or gold is conceivable, for example. Preferably, the second electronic component 31 is finally mounted on the second metallization layer 35 on the outside A. Furthermore, it is intended that a cover element is attached to the electronic module 10 and the provided electronic module is subjected to a final inspection.

Figure 4:
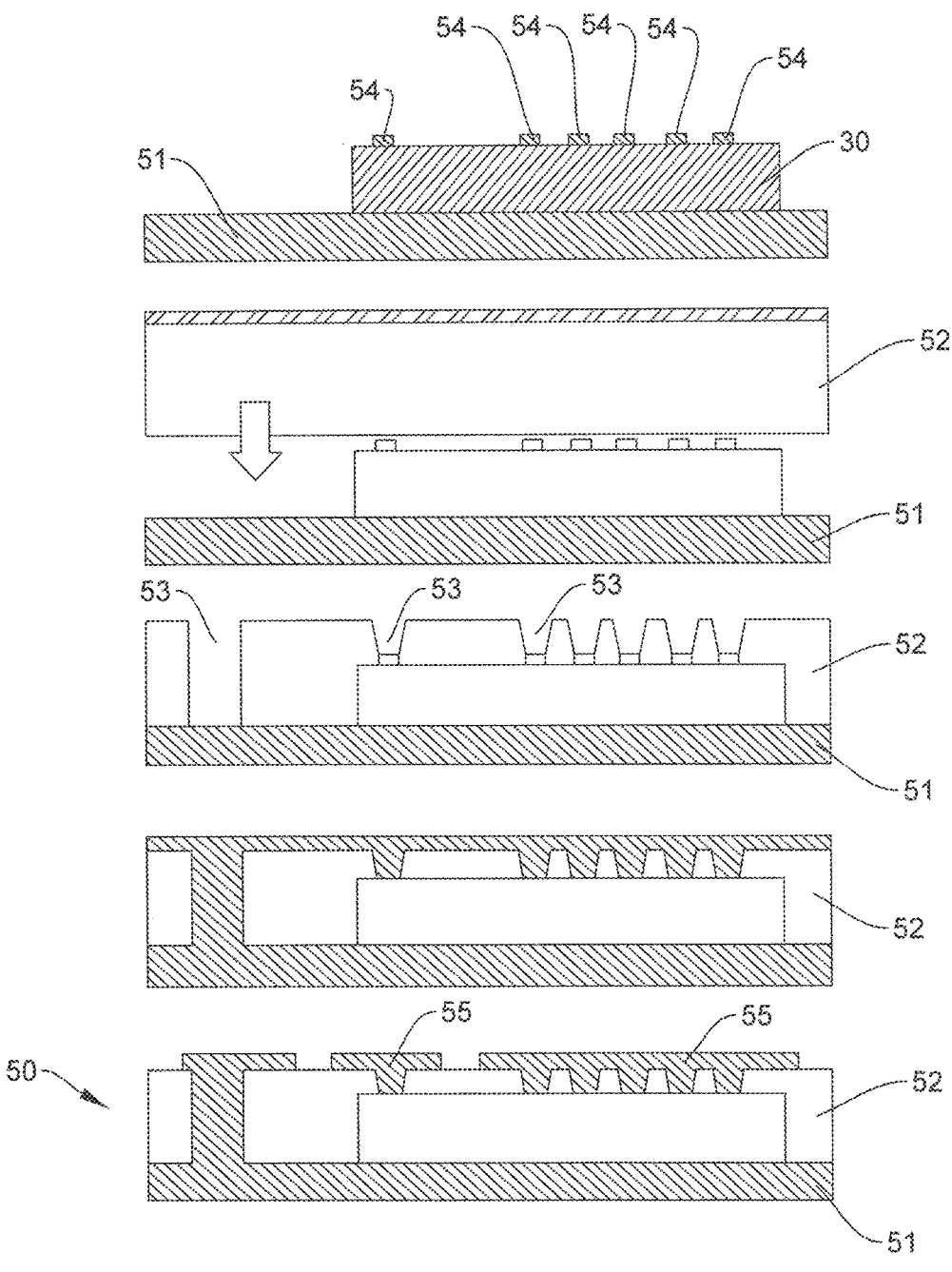

FIG. 4 shows a schematic and exemplary process for the production of a pre-laminate 50. It is intended that a first component 30 with component side connections 54 is applied to a PCB 51. Subsequently, the PCB 51 and the first component 30 are laminated in such a way that the first component 30 is arranged or embedded within a matrix 52, for example a dielectric matrix 52. The dielectric matrix 52 is structured to expose the component side connections 54. This results in recesses 53 which extend up to the printed circuit board 51 or to the electrical connections 54. These recesses 53 are filled with a conductive material, which also covers the outside of the dielectric matrix 52. The conductive material is then structured on the outside to provide the pre-composite contact areas 55. These pre-laminated contact pads 55 represent the contact areas of the first components within the encapsulation 20 and are in contact with the via 5 of the encapsulation 20. The advantage of using the pre-laminate 50 is that the pre-laminate side contact areas 55 can be larger than the component side contact areas 53, thus avoiding that the through-hole 5 of the encapsulation 20 cannot be connected to the first component 30 due to a production-related offset of the through-hole 5.

REFERENCE CHARACTER LIST

1 Electronic module
5 via
5' Further through hole
10 Substrate
11 Primary layer
12 Secondary layer
15th Metallization layer
16 Intermediate layer
20 Encapsulation
25 Component side
30 First electronic component
31 Second electronic component
35 Second metallization layer
50 Pre-lamination
51 Circuit board
52 Matrix
53 Recess
54 Component side connections
55 Connections on the compound side
60 Cooling structure
61 Sealing element
101 Providing a carrier substrate
102 Encapsulation
103 Temporary plating of a through hole
104 Forming a structured second metallization layer
105 Surface modification
A Outside
L Length

The invention claimed is:

1. An electronic module, comprising
   an encapsulation and
   a carrier substrate at least partially embedded in the encapsulation and having a component side, which has a first metallization layer and on which at least one first electronic component is arranged,
   wherein the first electronic component is enclosed by the encapsulation and the carrier substrate is a metal-ceramic substrate,
   wherein at least one second metallization layer for at least one second electronic component, in particular for controlling the first electronic component, is provided on an outside of the encapsulation,
   wherein the encapsulation has at least one through hole plating for an electrical connection of the first electronic component and the second electronic component., wherein the carrier substrate has a cooling structure on its side opposite to the component side and wherein an outer surface of the carrier substrate is covered by the encapsulation to more than 50%, wherein the second metallization layer is structured and/or wherein a distance between the first metallization layer and the second metallization layer measured perpendicular to a main extension plane is less than 1 mm.

2. The electronic module according to claim 1, wherein the second metallization layer is structured and/or wherein a distance between the first metallization layer and the second metallization layer measured perpendicular to a main extension plane is less than 5 mm.

3. The electronic module according to claim 2, wherein the second metallization layer is structured and/or wherein a distance between the first metallization layer and the second metallization layer measured perpendicular to a main extension plane is less than 1 mm.

4. The electronic module according to claim 1, wherein the carrier substrate comprises a primary layer, a secondary layer and a metallic intermediate layer arranged between the primary layer and the secondary layer.

5. The electronic module according to claim 4, wherein a further through hole plating is provided for electrically connecting the intermediate layer to the first and/or second electronic component, wherein the further through hole plating extends at least through the primary layer.

6. The electronic module according to claim 4, wherein the carrier substrate comprises a primary layer, a secondary layer and a metallic intermediate layer arranged between the primary layer and the secondary layer as an electronic return conductor, the intermediate layer being thicker than the primary layer and/or the secondary layer and/or thicker than 1 mm.

7. The electronic module according to claim 1, wherein a contacting plane, arranged between the outside of the encapsulation and the component side of the carrier substrate, is provided in the encapsulation, the contacting plane extending obliquely and/or transversely to the direction of extension of the through holes platings for connecting at least two through holes platings.

8. The electronic module according to claim 1, wherein the carrier substrate has a cooling structure on its side opposite to the component side.

9. The electronic module according to claim 8, wherein the electronic module has a sealing element for fluid-tight connection to a fluid cooling device.

10. The electronic module according to claim 1, wherein the through hole plating has a length between 0.1 and 15 mm.

11. The electronic module (1) according claim 1, wherein through hole plating respectively has a cross-section, dimensioned in a direction parallel to a main extension plane, of less than 5 mm$^2$.

12. The electronic module according claim 11, wherein through hole plating respectively has a cross-section, dimensioned in a direction parallel to a main extension plane, less than 1.5 mm$^2$ when the through hole plating is directly connected to the first component.

13. The electronic module according claim 11, wherein through hole plating respectively has a cross-section, dimensioned in a direction parallel to a main extension plane, less than 1.5 mm$^2$ when the through hole plating (5) is directly connected to an upper side of the first component.

14. The electronic module according to claim 1, wherein the encapsulation is made of an epoxy encapsulation component as encapsulation material.

15. The electronic module claim 1, wherein the through hole plating is oblique to a direction extending perpendicular to a main extension plane of the carrier substrate (10).

16. A method for manufacturing an electronic module according to claim 1, the method comprising:

providing a carrier substrate equipped with a first electronic component, the first electronic component being bonded to a first metallization layer of the carrier substrate, at least partial enclosing an equipped carrier substrate with an encapsulation, forming a through hole plating in the encapsulation for providing an electrical connection between the first electronic component and a second electronic component on an outside of the encapsulation; and forming a second metallization layer for the second electronic component on the outside of the encapsulation.

17. The method according to claim 16, wherein the encapsulation is formed by an injection moulding process.

18. The method according to claim 16, wherein the second metallization layer on the outside of the encapsulation is realized by a metal foil inserted into an injection and/or injection press mould during the injection moulding and/or injection press process, by physical vapour deposition and/or by electrochemical deposition.

19. The method according to claim 16, wherein the encapsulation is formed around an equipped carrier substrate.

20. The electronic module according to claim 1, wherein the electrical connection of the first electronic component and the second electronic component is a direct electrical connection.

* * * * *